US012772635B2

(12) United States Patent
Xiang et al.

(10) Patent No.: US 12,772,635 B2
(45) Date of Patent: Oct. 20, 2026

(54) DISPLAY PANEL AND SPLICING SCREEN INCLUDING THE SAME

(71) Applicant: Shenzhen China Star Optoelectronics Semiconductor Display Technology Co., Ltd., Shenzhen (CN)

(72) Inventors: Changming Xiang, Shenzhen (CN); Weiji Zhang, Shenzhen (CN); Rui Zhao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 747 days.

(21) Appl. No.: 18/193,749

(22) Filed: Mar. 31, 2023

(65) Prior Publication Data

US 2024/0266486 A1 Aug. 8, 2024

(30) Foreign Application Priority Data

Feb. 7, 2023 (CN) ......................... 202310146235.0

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ....... H10K 59/90; H10K 59/95; H10W 90/00; H10D 86/441; H10D 86/60; H10H 20/85
See application file for complete search history.

(56) References Cited

U.S. PATENT DOCUMENTS

| | | | | |
|---|---|---|---|---|
| 12,009,464 B2 * | 6/2024 | Wu | ..................... | H01L 25/0753 |
| 2014/0184057 A1 * | 7/2014 | Kim | ....................... | H05K 1/189 313/504 |
| 2017/0365652 A1 * | 12/2017 | Li | ........................ | H10D 86/411 |
| 2020/0286817 A1 * | 9/2020 | Choi | ................. | H01L 23/49838 |
| 2021/0335896 A1 * | 10/2021 | Choi | .................... | H10K 59/123 |

FOREIGN PATENT DOCUMENTS

| | | | | |
|---|---|---|---|---|
| CN | 113257143 A * | 8/2021 | ............... | G09F 9/33 |

* cited by examiner

*Primary Examiner* — Ismail A Muse
(74) *Attorney, Agent, or Firm* — Menachem Nathan; Nathan & Associates

(57) ABSTRACT

The present disclosure provides a display panel and a splicing screen including the same. The display panel includes a circuit substrate, a substrate, a display assembly, a chip on film, a fan-out part, and a connection wiring. The circuit substrate includes an installation area and a connection area, and is provided with a wiring through-hole defined at the connection area. The fan-out part includes a plurality of fan-out wirings, and an end of the fan-out wirings is connected to the chip on film. A first end of the connection wiring is connected to a driving circuit layer of the display assembly, and a second end of the connection wiring is connected to another end of the fan-out wirings through the wiring through-hole.

19 Claims, 2 Drawing Sheets

1

DISPLAY PANEL AND SPLICING SCREEN INCLUDING THE SAME

TECHNICAL FIELD

The present disclosure relates to the technical field of display, in particular to a display panel and a splicing screen including the same.

BACKGROUND

At present, a screen percentage of display panels applied to electronic products is increasing, therefore, full screens have become a trend pursued by users. However, there are circuit designs such as fan-out wirings and binding terminals in binding areas of existing display panels, the fan-out wirings and the binding terminals are generally formed on back surfaces of substrates of the display panels in splicing display products, so as to reduce widths of border frames of the display panels.

Signal wirings formed on side surfaces of substrates of the display panels are generally used to transmit signals from front surfaces of the substrates to back surfaces of the substrates in general splicing technology. Single substrates need to be spliced into a large size of display panels to form final display products, which can realize a display mode of unlimited sizes. In actual processes of splicing, the above-mentioned splicing method exists following problems: the signal wirings need to be disposed on a front surface and a back surface of a substrate of each display panel, resulting in cumbersome processes and relatively high cost.

SUMMARY

Embodiments of the present disclosure provide a display panel and a splicing screen including the same to alleviate deficiencies in related prior art.

Embodiments of the present disclosure provide the display panel, including:

- a circuit substrate, including at least one installation area and at least one connection area, and provided with a wiring through-hole defined at the connection area, wherein one installation area is spaced with adjacent one connection area;
- at least one substrate, disposed on a side of the circuit substrate, and located at the installation area;
- at least one display assembly, disposed on a side of the substrate away from the circuit substrate, and including a driving circuit layer and a plurality of light-emitting elements connected to the driving circuit layer;
- at least one chip on film, disposed on a side of the circuit substrate away from the substrate;
- at least one fan-out part, disposed between the circuit substrate and the chip on film, wherein the fan-out part includes a plurality of fan-out wirings, and an end of the fan-out wirings is connected to the chip on film; and
- at least one group of connection wiring, wherein a first end of the connection wiring is connected to the driving circuit layer, and a second end of the connection wiring is connected to another end of the fan-out wirings through the wiring through-hole.

In the display panel provided by the embodiments of the present disclosure, the circuit substrate includes a groove defined at the installation area, and the substrate is disposed in the groove.

In the display panel provided by the embodiments of the present disclosure, the driving circuit layer includes a first connection terminal disposed close to the connection area; and

- the circuit substrate further includes a second connection terminal located at the connection area, an end of the second connection terminal is connected to the first connection terminal, and another end of the second connection terminal is connected to the first end of the connection wiring.

In the display panel provided by the embodiments of the present disclosure, the second connection terminal is located on a side of the circuit substrate close to the driving circuit layer, and a side of the second connection terminal away from the wiring through-hole is flush with a side of the first connection terminal away from the substrate.

In the display panel provided by the embodiments of the present disclosure, an orthographic projection of the second connection terminal on the circuit substrate covers an orthographic projection of the wiring through-hole on the circuit substrate.

In the display panel provided by the embodiments of the present disclosure, the display panel further includes a connection part, the connection part is disposed on a side of the circuit substrate close to the driving circuit layer, and connected between the first connection terminal and the second connection terminal.

In the display panel provided by the embodiments of the present disclosure, the circuit substrate is a printed circuit board or a flexible printed circuit.

In the display panel provided by the embodiments of the present disclosure, the circuit substrate includes a plurality of installation areas and a plurality of connection areas, and one of the connection areas is located between adjacent two of the installation areas;

- the display panel includes a plurality of substrates, a plurality of display assemblies, a plurality of chip on films, a plurality of fan-out parts, and a plurality of connection wirings, wherein one of the substrates is disposed corresponding to one of the installation areas, one of the display assemblies is disposed corresponding to one of the substrates, one of the chip on films is disposed corresponding to one of the substrates, and one of the fan-out parts is disposed corresponding to one of the chip on films, and one of the connection wirings is disposed corresponding to one of the display assemblies.

In the display panel provided by the embodiments of the present disclosure, the display panel further includes an encapsulation layer, the encapsulation layer is located on the display assembly, and the encapsulation layer includes a black adhesive layer and a protective layer;

- wherein the black adhesive layer covers the light-emitting elements, at least one light-emitting surface of each of the light-emitting elements is exposed to the black adhesive layer, and the protective layer covers the black adhesive layer and the light-emitting elements.

Embodiments of the present disclosure provide a splicing screen, including at least two display panels described above.

Beneficial effects of the present disclosure: the present disclosure provides the display panel and the splicing screen including the same. The display panel includes the circuit substrate, at least one substrate, at least one display assembly, at least one chip on film, at least one fan-out part, and at least one group of connection wiring. The circuit substrate includes at least one installation area and at least one connection area providing with a wiring through-hole. The installation area and the connection area are disposed at intervals. The substrate is disposed on a side of the circuit substrate, and located at the installation area. The display assembly is disposed on a side of the substrate away from the circuit substrate, and including the driving circuit layer and the plurality of light-emitting elements. The chip on film is disposed on a side of the circuit substrate away from the substrate. The fan-out part is disposed between the circuit substrate and the chip on film. The fan-out part includes the plurality of fan-out wirings, and an end of the fan-out wirings is connected to the chip on film. By disposing the first end of the connection wiring being connected to the driving circuit layer, the second end of the connection wiring being connected to another end of the fan-out wirings through the wiring through-hole, there is no need to dispose signal wirings on a front surface and a back surface of the substrate, thereby reducing difficulty of a manufacturing process of the display panel.

BRIEF DESCRIPTION OF DRAWINGS

In order to explain technical solutions in the embodiments of the present disclosure more clearly, the following will briefly introduce the drawings needed to be used in description of the embodiments. Obviously, the drawings in the following description are only some embodiments of the present disclosure. For those skilled in the art, other drawings can be obtained from these drawings without paying creative effort.

DETAILED DESCRIPTION OF EMBODIMENT

Figure 1:
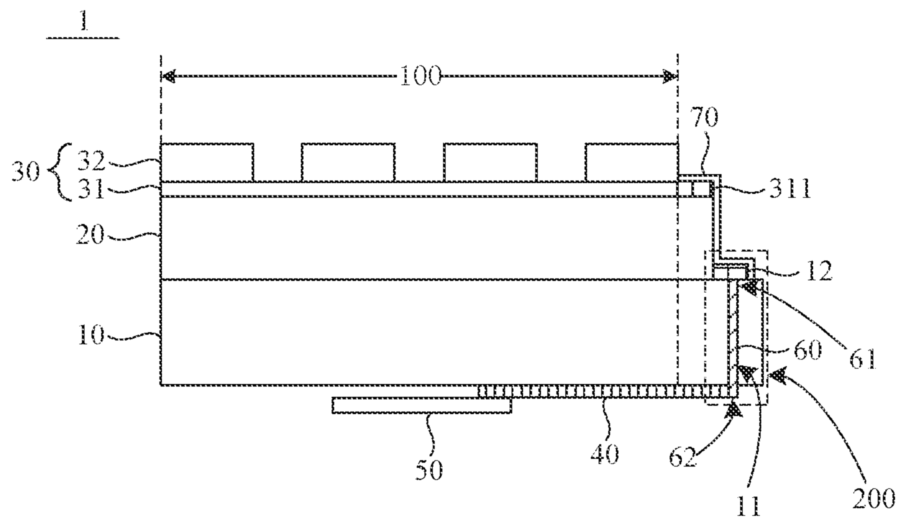
FIG. 1 is a first schematic sectional diagram of a display panel according to an embodiment of the present disclosure.

In combination with drawings in the embodiments of the present disclosure, technical solutions in the embodiments of the present disclosure will be described clearly and completely. Obviously, the described embodiments are only part of the embodiments of the present disclosure, not all of them. Based on the embodiments of the present disclosure, all other embodiments obtained by those skilled in the art without creative effort belong to a scope of the present disclosure. In addition, it should be understood that specific embodiments described herein are only used to explain and interpret the present disclosure and are not used to limit the present disclosure. In the present disclosure, location terms used, such as "up" and "down", generally refer to up and down in actual using or working state of devices, in particular drawing directions in the drawings, unless otherwise described; terms "inside" and "outside" refer to outlines of the devices.

Embodiments of the present disclosure provide a display panel and a splicing screen including the same. The following are described in detail. It should be noted that a description order of the following embodiments does not limit a preferred order of the embodiments.

Technical solutions of the present disclosure are described in combination with specific embodiments.

Embodiment 1

Please refer to FIG. 1, and FIG. 1 is a first schematic sectional diagram of a display panel according to an embodiment of the present disclosure.

The embodiment provides a display panel 1, and the display panel 1 includes a circuit substrate 10, a substrate 20, a display assembly 30, a chip on film 50, a fan-out part 40, and a group of connection wiring 60.

The circuit substrate 10 includes an installation area 100 and a connection area 200. The installation area 100 and the connection area 200 are disposed at intervals. The circuit substrate 10 is provided with a wiring through-hole 11 located at the connection area 200. The substrate 20 is disposed on a side of the circuit substrate 10, and located at the installation area 100. The display assembly 30 is disposed on a side of the substrate 20 away from the circuit substrate 10, and includes a driving circuit layer 31 and a plurality of light-emitting elements 32 connected to the driving circuit layer 31. The chip on film 50 is disposed on a side of the circuit substrate 10 away from the substrate 20. The fan-out part 40 is disposed between the circuit substrate 10 and the chip on film 50, and includes a plurality of fan-out wirings (not marked in the figures), and an end of the fan-out wirings is connected to the chip on film 50. A first end 61 of the connection wiring 60 is connected to the driving circuit layer 31, and a second end 62 of the connection wiring 60 is connected to another end of the fan-out wirings through the wiring through-hole 11.

It should be noted that a number of installation areas 100, a number of connection areas 200, a number of substrates 20, a number of display assemblies 30, a number of chip on films 50, a number of fan-out parts 40, and a number of groups of connection wiring 60 are not limited in the present disclosure. The embodiment only exemplifies a technical solution of the present disclosure by taking a structure of the circuit substrate 10, including one installation area 100, one connection area 200, one substrate 20, one display assembly 30, one chip on film 50, one fan-out part 40, and one group of connection wiring 60 as an example.

In the embodiment, the substrate 20 may include a flexible substrate or a rigid substrate. Specifically, when the substrate 20 includes the flexible substrate, a material of the flexible substrate may include at least one of acrylic resin, methacrylic resin, polyisoprene, vinyl resin, epoxy resin, polyurethane resin, cellulose resin, siloxane resin, polyimide resin, and polyamide resin. When the substrate 20 includes the rigid substrate, a material of the rigid substrate may include one of metal or be a glass. A material of the substrate may be selected according to actual situations, and is not specifically limited in the embodiment.

The plurality of light-emitting elements 32 are disposed on a side of the driving circuit layer 31 away from the substrate 20. The light-emitting elements 32 may be mini light-emitting diodes (Mini LEDs) or micro light-emitting diodes (Micro LEDs). The plurality of light-emitting elements 32 are arranged on the substrate 20 in an array, and a size of the light-emitting element 32 and a spacing of adjacent two light-emitting elements 32 in a row direction and a column direction may be designed according to actual requirements.

By disposing the first end 61 of the connection wiring 60 being connected to the driving circuit layer 31, and the second end 62 of the connection wiring 60 being connected to another end of the fan-out wiring through the wiring through-hole 11 in the embodiment, the chip on film 50 can be connected to the driving circuit layer 31. Since the fan-out part 40 and the chip on film 50 are disposed on a side of the circuit substrate 10 away from the substrate 20, there is no need to disposed signal wirings on both a front surface and a back surface of the substrate 20 in the embodiment, thereby reducing difficulty of a manufacturing process of the display panel 1 and manufacturing cost of the display panel 1.

Further, the circuit substrate 10 includes, but is not limited to, one of a printed circuit substrate (PCB) and a flexible printed circuit (FPC). A thickness of the circuit substrate 10 ranges between 0.7 mm and 1.2 mm. In some embodiments, the thickness of the circuit substrate 10 is 0.7 mm, 1 mm, or 1.2 mm.

It can be understood that, compared with a design of punching holes on a glass substrate in the prior art, the circuit substrate 10 of the embodiment includes but not limited to one of the printed circuit substrate and the flexible circuit substrate, that is, the circuit substrate 10 can be made of a material that is more convenient to punch holes than the glass substrate. Therefore, a yield of punching the wiring through-hole 11 can be improved to raise a yield of the display panel 1. At a same time, the thickness of the circuit substrate 10 is designed to be ranged between 0.7 mm and 1.2 mm, so as to reduce a thickness of the display panel 1.

Further, in the embodiment, the driving circuit layer 31 includes a first connection terminal 311 disposed close to the connection area 200, and the circuit substrate 10 also includes a second connection terminal 12 located at the connection area 200. An end of the second connection terminal 12 is connected to the first connection terminal 311, and another end of the second connection terminal 12 is connected to the first end 61 of the connection wiring 60. Specifically, the display panel 1 also includes a connection part 70 which is disposed on a side of the circuit substrate 10 close to the driving circuit layer 31. The connection part 70 is connected between the first connection terminal 311 and the second connection terminal 12. The connection part 70 includes but is not limited to one of silver glue and a metal wiring.

Specifically, an orthographic projection of the second connection terminal 12 on the circuit substrate 10 at least partially covers an orthographic projection of the wiring through-hole 11 on the circuit substrate 10, or the orthographic projection of the second connection terminal 12 on the circuit substrate 10 does not overlap the orthographic projection of the wiring through-hole 11 on the circuit substrate 10. In some embodiments, the orthographic projection of the second connection terminal 12 on the circuit substrate 10 overlaps the orthographic projection of the wiring through-hole 11 on the circuit substrate 10, thereby reducing a width of a part of the circuit substrate 10 located at the connection area 200, so as to reduce a width of splicing seams when the display panel 1 is applied to splicing screens.

In the embodiment, the wiring through-hole 11 passes through the circuit substrate 10, the chip on film 50 is disposed on a side of the circuit substrate 10 away from the substrate 20, and the fan-out part 40 is disposed between the circuit substrate 10 and the chip on film 50. The fan-out part 40 includes a plurality of fan-out wirings. An end of the fan-out wirings is connected to the chip on film 50, and the connection wiring 60 is disposed corresponding to the fan-out wiring. By disposing the second connection terminal 12 being connected to the first connection terminal 311 through the connection part 70, driving signals can be transmitted to the driving circuit layer 31, and then by disposing the connection wiring 60 being electrically connected to the fan-out wiring and the fan-out wiring being connected to the chip on film 50, so that the chip on film 50 is electrically connected to the second connection terminal 12 and the first connection terminal 311, so as to drive the display panel 1 to work normally, and avoid voltage drop caused by a long route of a circuit. At a same time, when the display panel 1 is applied to splicing screens, it can also improve a phenomenon of a too large splicing seam caused by a presence of the chip on film 50 during splicing, so as to improve a display effect of the splicing screens and save manufacturing cost of the splicing screens.

Embodiment 2

Figure 2:
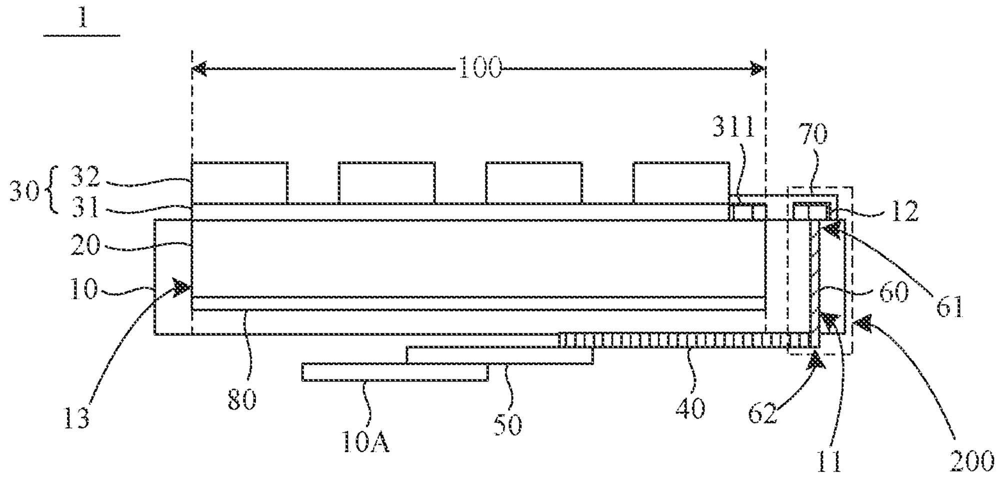
FIG. 2 is a second schematic sectional diagram of the display panel according to an another embodiment of the present disclosure.
Figure 3:
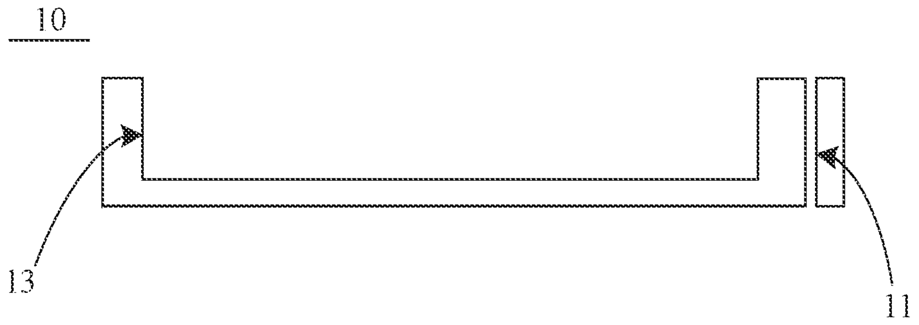
FIG. 3 is a first schematic sectional diagram of a circuit substrate according to another embodiment of the present disclosure.

Please refer to FIG. 2 and FIG. 3. FIG. 2 is a second schematic sectional diagram of the display panel according to an another embodiment of the present disclosure, and FIG. 3 is a first schematic sectional diagram of a circuit substrate according to another embodiment of the present disclosure.

In the embodiment, a structure of the display panel is similar to a structure of the display panel provided in the above-mentioned embodiment 1. Differences between the two are as following.

In the embodiment, the circuit substrate 10 is provided with a groove 13 defined at the installation area 100, and the substrate 20 is disposed in the groove 13. The display panel 1 also includes an adhesive layer 80 between the substrate 20 and the circuit substrate 10. The adhesive layer 80 is disposed in the groove 13, and the substrate 20 is bonded with the groove 13 through the adhesive layer 80. An orthographic projection of the adhesive layer 80 on the circuit substrate 10 covers an orthographic projection of a bottom part of the groove 13 on the circuit substrate 10, and an orthographic projection of the substrate 20 on the circuit substrate 10 covers the orthographic projection of the adhesive layer 80 on the circuit substrate 10.

By disposing the circuit substrate 10 being provided with the groove 13 defined at the installation area 100, and the substrate 20 being disposed in the groove 13 in the embodiment, relative displacement and friction can be avoided after the substrate 20 is connected to the circuit substrate 10, thus avoiding damage of the substrate 20. Moreover, since the substrate 20 is bonded with the groove 13 through the adhesive layer 80, a structure of the display panel can be made more compact.

Further, in the embodiment, the second connection terminal 12 is disposed on a side of the circuit substrate 10 close to the driving circuit layer 31, and a side of the second connection terminal 12 away from the wiring through-hole 11 is flush with a side of the first connection terminal 311 away from the substrate 20. Specifically, the second connection terminal 12 and the first connection terminal 311 are disposed on a same layer and at intervals, and the connection part 70 is disposed on a side of the circuit substrate 10 away from the chip on film 50, so as to maintain a flat state of the display panel 1 and improve a display effect of the display panel 1. Moreover, since the side of the second connection terminal 12 away from the wiring through-hole 11 is flush with the side of the first connection terminal 311 away from the substrate 20, so that the connection part 70 can be disposed to be a plane part. When the connection part 70 is silver glue, phenomena of disconnection and deformation of the connection part 70 can be effectively alleviated, so as to improve reliability of the connection part 70.

It should be noted that the display panel 1 of the embodiment also includes a driving circuit substrate 10A, the driving circuit substrate 10A is disposed on a side of the circuit substrate 10 away from the substrate 20, and the driving circuit substrate 10A is connected to the chip on film 50.

Embodiment 3

Figure 4:
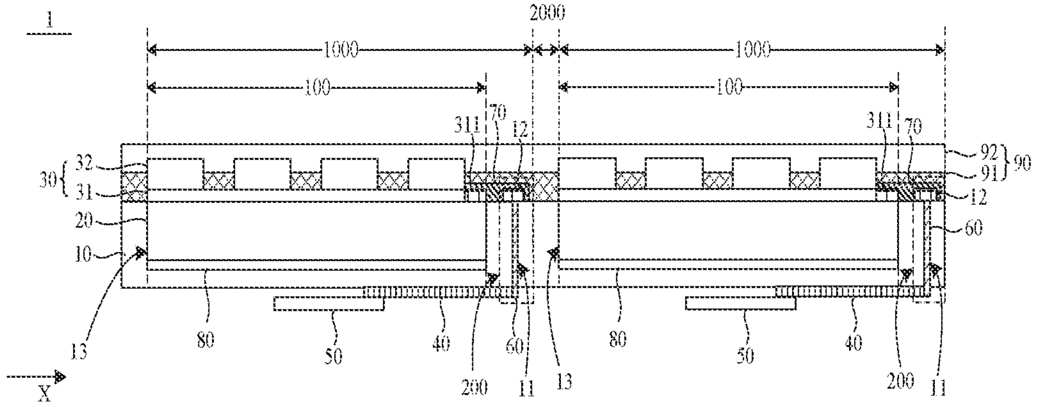
FIG. 4 illustrates a third schematic sectional diagram of the display panel according to another embodiment of the present disclosure.
Figure 5:
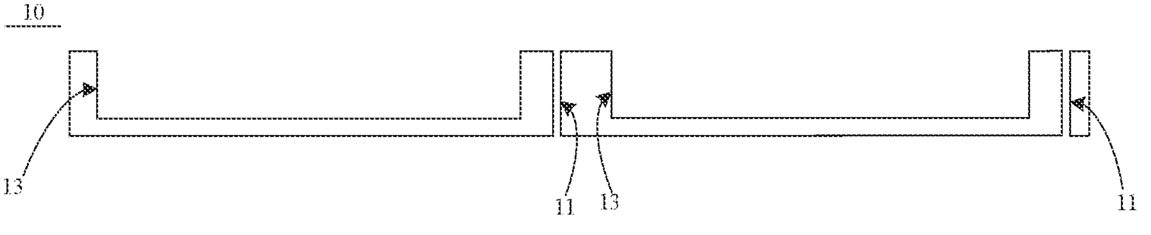
FIG. 5 illustrates a second schematic sectional diagram of the circuit substrate according to another embodiment of the present disclosure.

Please refer to FIG. 4 and FIG. 5. FIG. 4 illustrates a third schematic sectional diagram of the display panel according to another embodiment of the present disclosure, and FIG. 5 illustrates a second schematic sectional diagram of a circuit substrate according to another embodiment of the present disclosure.

In the embodiment, a structure of the display panel is similar to a structure of the display panel 1 provided in the above-mentioned embodiment 2. Differences between the two are as following.

In the embodiment, the circuit substrate 10 includes a plurality of installation areas 100 and a plurality of connection areas 200, and the connection area 200 is located between adjacent two installation areas 100. The display panel 1 includes a plurality of substrates 20, a plurality of display assemblies 30, a plurality of chip on films 50, a plurality of fan-out parts 40, and a plurality of groups of connection wiring 60. The substrate 20 is disposed corresponding to the installation area 200, the display assembly 30 is disposed corresponding to the substrate 20, the chip on film 50 is disposed corresponding to the substrate 20, the fan-out part 40 is disposed corresponding to the chip on film 50, and the connection wiring 60 is disposed corresponding to the display assembly 30.

The circuit substrate 10 includes a plurality of grooves 13, the groove 13 is disposed corresponding to the installation area 100, and each substrate 20 is correspondingly disposed in the groove 13.

It should be noted that the embodiment takes the circuit substrate 10 including two installation areas 100, one connection area 200, two substrates 20, two display assemblies 30, two chip on films 50, two fan-out parts 40, two groups of connection wiring 60, and two grooves 13 as an example to illustrate a technical solution of the present disclosure.

By disposing the substrate 20 in the groove 13, a connection between the substrate 20 and the circuit substrate 10 can be much tighter. At a same time, a relative displacement between adjacent two substrates 20 can be avoided, which can avoid damage to the substrate 20, so as to make a structure of the display panel more compact.

In the embodiment, the wiring through-hole 11 passes through the circuit substrate 10, the chip on film 50 is disposed on a side of the circuit substrate 10 away from the substrate 20, and the fan-out part 40 is disposed between the circuit substrate 10 and the chip on film 50. The fan-out part 40 includes a plurality of fan-out wirings, an end of the fan-out wirings is connected to the chip on film 50, and the connection wiring 60 is disposed corresponding to the fan-out wiring. By disposing the second connection terminal 12 being connected to the first connection terminal 311 through the connection part 70, driving signals can be transmitted to the driving circuit layer 31, and by disposing the connection wiring 60 being electrically connected to the fan-out wiring and the fan-out wiring being connected to the chip on film 50, so that the chip on film 50 can be electrically connected to the second connection terminal 12 and the first connection terminal 311, so as to drive the display panel 1 to work normally.

At a same time, in the embodiment, the circuit substrate 10 is disposed including a plurality of electrical connection areas 1000, the plurality of electrical connection areas 1000 are arranged along a first direction X, each electrical connection area 1000 includes the installation area 100 and the connection area 200 arranged along the first direction X, so that the plurality of substrates 20 can be disposed on the circuit substrate 10, thereby saving manufacturing cost of the display panel 1.

Moreover, by defining a splicing area 2000 between adjacent two electrical connection areas 1000 in the embodiment, the electrical connection area 1000 includes the installation area 100 and the connection area 200 arranged along the first direction X, a spacing between adjacent two substrates 20 can be reduced, that is, a width of a splicing seam defined between two substrates 20 can be reduced, thereby improving the display effect of the display panel 1.

Further, in the embodiment, the display panel 1 also includes an encapsulation layer 90, and the encapsulation layer 90 is disposed on a side of the display panel 1 away from the circuit substrate 10. The encapsulation layer 90 includes a black adhesive layer 91 and a protective layer 92. The black adhesive layer 91 covers the light-emitting element 32, and at least one light-emitting surface of the light-emitting element 32 is exposed to the black adhesive layer 91. The protective layer 92 covers the black adhesive layer 91 and the light-emitting elements 32.

Specifically, the display assembly 30 includes the driving circuit layer 31 and the plurality of the light-emitting elements 32. The plurality of the light-emitting elements 32 are disposed on a side of the driving circuit layer 31 away from the substrate 20, and connected to the driving circuit layer 31. A size of the light-emitting element 32 and a spacing of adjacent two light-emitting elements 32 in a row direction and a column direction may be disposed according to actual requirements.

The black adhesive layer 91 is disposed on a side of the light-emitting elements 32 away away from the driving circuit layer 31. The black adhesive layer 91 covers the circuit substrate 10 and the connection part 70, and at least one light-emitting surface of the light-emitting element 32 is exposed to the black adhesive layer 91. That is, gaps between the plurality of light-emitting elements 32 are filled with the black adhesive layer 91, and a side of the black adhesive layer 91 away from the circuit substrate 10 is a plane, so that light transmission between adjacent light-emitting elements 32 is opaque.

By disposing the black adhesive layer 91 on the side of the light-emitting elements 32 away from the driving circuit layer 31, and covering the circuit substrate 10 and the connection part 70, and at least one light-emitting surface of the light-emitting element 32 being exposed to the black adhesive layer 91, a problem of splicing seam caused by lack of disposing the light-emitting elements 32 at the splicing area 2000 can be improved, which can improve the display effect of the display panel 1.

Further, by disposing the protective layer 92 on the side of the black adhesive layer 91 away from the circuit substrate 10, and covering the black adhesive layer 91 and the light-emitting elements 32, the light-emitting elements 32 can be protected, thereby avoiding damage of the light-emitting elements 32, so as to improve a yield of the light-emitting elements 32.

An embodiment provides a splicing screen, and the splicing screen includes at least two display panels described in any of the above-mentioned embodiments.

It should be understood that the display panel has been described in detail in the above-mentioned embodiments, and will not be repeated here.

To sum up, the present disclosure provides the display panel and the splicing screen including the same. The display panel includes the circuit substrate, at least one substrate, at least one display assembly, at least one chip on film, at least one fan-out part, and at least one group of connection wiring. The circuit substrate includes at least one installation area and at least one connection area providing with a wiring through-hole. The installation area and the connection area are disposed at intervals. The substrate is disposed on a side of the circuit substrate, and located at the installation area. The display assembly is disposed on a side of the substrate away from the circuit substrate, and including the driving circuit layer and the plurality of light-emitting elements. The chip on film is disposed on a side of the circuit substrate away from the substrate. The fan-out part is disposed between the circuit substrate and the chip on film. The fan-out part includes the plurality of fan-out wirings, and an end of the fan-out wirings is connected to the chip on film. By disposing the first end of the connection wiring being connected to the driving circuit layer, the second end of the connection wiring being connected to another end of the fan-out wirings through the wiring through-hole, there is no need to dispose signal wirings on a front surface and a back surface of the substrate, thereby reducing difficulty of a manufacturing process of the display panel.

In the above-mentioned embodiments, the description of each embodiment has its own emphasis. For the part not detailed in one embodiment, please refer to the relevant description of other embodiments.

The display panel and the splicing screen including the same provided by the embodiments of the present disclosure are described in detail. In this paper, specific embodiments are adopted to illustrate a principle and implementation modes of the present disclosure. The description of the above-mentioned embodiments is only used to help understand methods and a core idea of the present disclosure. At the same time, for those skilled in the art, of the idea of the present disclosure, there will be changes in specific implementation modes and a scope of the present disclosure. In conclusion, contents of the specification should not be interpreted as a limitation of the present disclosure.

What is claimed is:

1. A display panel, comprising:

a circuit substrate, comprising at least one installation area and at least one connection area, and provided with a wiring through-hole defined at the connection area and a groove defined at the installation area, wherein one installation area is spaced with adjacent one connection area;

at least one substrate, disposed on a side of the circuit substrate, and disposed in the groove;

at least one display assembly, disposed on a side of the substrate away from the circuit substrate, and comprising a driving circuit layer;

at least one chip on film, disposed on a side of the circuit substrate away from the substrate;

at least one fan-out part, disposed between the circuit substrate and the chip on film, wherein the fan-out part comprises a plurality of fan-out wirings, and an end of the fan-out wirings is connected to the chip on film; and at least one group of connection wiring, wherein a first end of the connection wiring is connected to the driving circuit layer, and a second end of the connection wiring is connected to another end of the fan-out wirings through the wiring through-hole.

2. The display panel of claim 1, further comprising an adhesive layer disposed between the substrate and the circuit substrate, wherein the adhesive layer is disposed in the groove, and the substrate is bonded with the groove through the adhesive layer.

3. The display panel of claim 2, wherein an orthographic projection of the substrate on the circuit substrate covers an orthographic projection of the adhesive layer on the circuit substrate.

4. The display panel of claim 1, wherein the driving circuit layer comprises a first connection terminal disposed close to the connection area; and the circuit substrate further comprises a second connection terminal located at the connection area, an end of the second connection terminal is connected to the first connection terminal, and another end of the second connection terminal is connected to the first end of the connection wiring.

5. The display panel of claim 4, wherein the second connection terminal is located on a side of the circuit substrate close to the driving circuit layer, and a side of the second connection terminal away from the wiring through-hole is flush with a side of the first connection terminal away from the substrate.

6. The display panel of claim 5, wherein an orthographic projection of the second connection terminal on the circuit substrate covers at least an orthographic projection of a part of the wiring through-hole on the circuit substrate.

7. The display panel of claim 5, further comprising a connection part disposed on a side of the circuit substrate close to the driving circuit layer, and connected between the first connection terminal and the second connection terminal.

8. The display panel of claim 7, wherein the connection part comprises silver glue or a metal wiring.

9. The display panel of claim 4, wherein the first connection terminal and the second connection terminal are disposed on a same layer and at intervals.

10. The display panel of claim 9, further comprising a connection part, disposed on a side of the circuit substrate close to the driving circuit layer, covering the first connection terminal and the second connection terminal, and filled between the first connection terminal and the second connection terminal, wherein a surface of the connection part away from the circuit substrate is plane.

11. The display panel of claim 1, wherein the circuit substrate is a printed circuit board or a flexible printed circuit.

12. The display panel of claim 1, wherein a thickness of the circuit substrate ranges between 0.7 mm and 1.2 mm.

13. The display panel of claim 1, wherein the circuit substrate comprises a plurality of installation areas and a plurality of connection areas, and one of the connection areas is defined between adjacent two of the installation areas;

the display panel comprises a plurality of substrates, a plurality of display assemblies, a plurality of chip on films, a plurality of fan-out parts, and a plurality of connection wirings, wherein one of the substrates is disposed corresponding to one of the installation areas, one of the display assemblies is disposed corresponding to one of the substrates, one of the chip on films is disposed corresponding to one of the substrates, one of the fan-out parts is disposed corresponding to one of the chip on films, and one of the connection wirings is disposed corresponding to one of the display assemblies.

14. The display panel of claim 13, wherein the circuit substrate further comprises a plurality of grooves, one of the grooves is correspondingly defined at the installation area, and one of the substrates is correspondingly disposed in one of the grooves.

15. The display panel of claim 13, wherein the circuit substrate comprises a plurality of electrical connection areas, the plurality of electrical connection areas are arranged along a first direction, and each of the electrical connection areas comprises one of the installation areas and one of the connection areas arranged along the first direction; wherein a splicing area is defined between adjacent two of the electrical connection areas.

16. The display panel of claim 1, wherein the display panel further comprises an encapsulation layer, the encapsulation layer is disposed on the display assembly, and the encapsulation layer comprises a black adhesive layer and a protective layer;

wherein the display assembly further comprises a plurality of light-emitting elements electrically connected to the driving circuit layer, the black adhesive layer covers the light-emitting elements, at least one light-emitting surface of each of the light-emitting elements is exposed to the black adhesive layer, and the protective layer covers the black adhesive layer and the light-emitting elements.

17. A display panel, comprising:

a circuit substrate, comprising an installation area and a connection area disposed at intervals, and provided with a wiring through-hole defined at the connection area and a groove defined at the installation area;

a connection wiring, disposed in the wiring through-hole;

a substrate, disposed on a side of the circuit substrate, and disposed in the groove;

a display assembly, disposed on a side of the substrate away from the circuit substrate, and comprising a driving circuit layer;

a chip on film, disposed on a side of the circuit substrate away from the substrate;

a fan-out part, disposed between the circuit substrate and the chip on film, wherein the fan-out part comprises a plurality of fan-out wirings, and an end of the fan-out wirings is connected to the chip on film; and a connection part, disposed on a side of the circuit substrate close to the driving circuit layer and located at the connection area;

wherein the driving circuit layer comprises a first connection terminal close to the connection area, and the circuit substrate comprises a second connection terminal disposed on a side of the circuit substrate close to the driving circuit layer and located at the connection area; the first connection terminal and the second connection terminal are disposed on a same layer and at intervals, and connected to each other through the connection part, the second connection terminal is connected to a first end of the connection wiring, and a second end of the connection wiring is connected to another end of the fan-out wirings through the wiring through-hole.

18. The display panel of claim 17, wherein a side of the second connection terminal away from the wiring through-hole is flush with a side of the first connection terminal away from the substrate.

19. A splicing screen, comprising at least two display panels, each of the display panels comprises:

a circuit substrate, comprising at least one installation area and at least one connection area, and provided with a wiring through-hole defined at the connection area and a groove defined at the installation area, wherein one installation area is spaced with adjacent one connection area;

at least one substrate, disposed on a side of the circuit substrate, and disposed in the groove;

at least one display assembly, disposed on a side of the substrate away from the circuit substrate, and comprising a driving circuit layer;

at least one chip on film, disposed on a side of the circuit substrate away from the substrate;

at least one fan-out part, disposed between the circuit substrate and the chip on film, wherein the fan-out part comprises a plurality of fan-out wirings, and an end of the fan-out wirings is connected to the chip on film; and at least one group of connection wiring, wherein a first end of the connection wiring is connected to the driving circuit layer, and a second end of the connection wiring is connected to another end of the fan-out wirings through the wiring through-hole.

* * * * *